United States Patent [19]

Kanebako et al.

[11] Patent Number: 5,278,078
[45] Date of Patent: Jan. 11, 1994

[54] METHOD OF MANUFACTURING SEMICONDUCTOR DEVICE

[75] Inventors: Kazunori Kanebako; Satoshi Inagi, both of Yokohama, Japan

[73] Assignee: Kabushiki Kaisha Toshiba, Kawasaki, Japan

[21] Appl. No.: 881,821

[22] Filed: May 12, 1992

[30] Foreign Application Priority Data

May 14, 1991 [JP] Japan .................. 3-109370

[51] Int. Cl.⁵ .................. H01L 21/426
[52] U.S. Cl. .................. 437/29; 437/37; 437/45; 437/48; 437/52
[58] Field of Search .......... 437/48, 45, 52, 29, 437/37

[56] References Cited

U.S. PATENT DOCUMENTS

| | | | |
|---|---|---|---|
| 4,359,817 | 11/1982 | Dickman et al. | 437/48 |
| 4,364,165 | 12/1982 | Dickman et al. | 437/48 |
| 4,364,167 | 12/1982 | Denley | 437/48 |
| 4,365,405 | 12/1982 | Dickman et al. | 437/48 |
| 4,818,716 | 4/1989 | Okuyama et al. | 437/48 |
| 4,898,840 | 2/1990 | Okuyama | 437/48 |
| 4,904,615 | 2/1990 | Okuyama et al. | 437/45 |
| 5,028,552 | 7/1991 | Ushiku | 437/45 |

FOREIGN PATENT DOCUMENTS 0073130 3/1983 European Pat. Off. .......... 437/45

*Primary Examiner*—Olik Chaudhuri
*Assistant Examiner*—Ourmazd S. Ojan
*Attorney, Agent, or Firm*—Foley & Lardner

[57] ABSTRACT

A method of manufacturing a semiconductor device having the steps of: forming a plurality of gate electrodes on a semiconductor substrate; forming an insulating film on every second gate electrode of the plurality of gate electrodes; coating resist on the whole surface of the semiconductor device to form a first resist film; patterning the first resist film and removing a predetermined area to form a second resist film, the end face of the second resist film being aligned with the surface of the gate electrode without the insulating film; implanting impurity ions, using the second resist film as a mask, at an acceleration voltage allowing to stop the implanted ions near to the surface of the semiconductor substrate under the gate electrode with the insulating film, of those gate electrodes not covered with the second resist film; removing the second resist film and coating resist on the whole surface of the semiconductor device to form a third resist film; patterning the third resist film and removing a predetermined area to form a fourth resist film, the end face of the fourth resist film being aligned with the surface of the gate electrode with the insulating film; and implanting the impurity ions, using the fourth resist film as a mask, at an acceleration voltage allowing to stop the implanted impurity ions near at the surface of the semiconductor substrate under the gate electrode without the insulating film among the gate electrodes not covered with the fourth resist film.

20 Claims, 9 Drawing Sheets

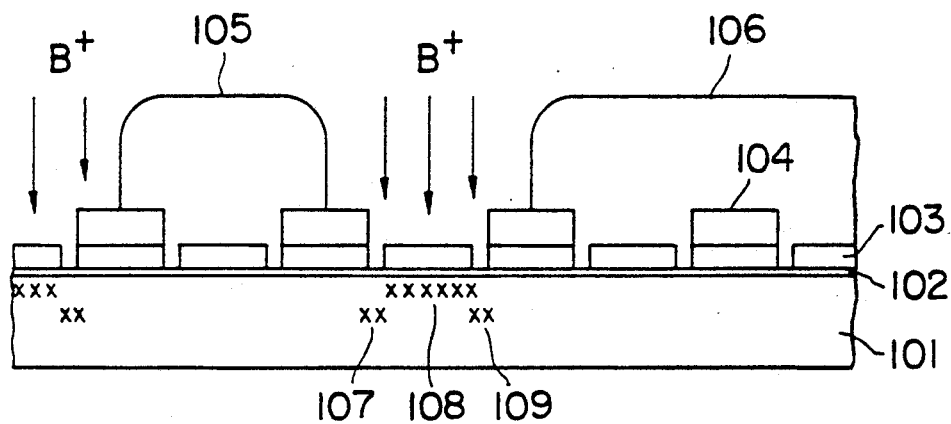
F I G. 1(a)
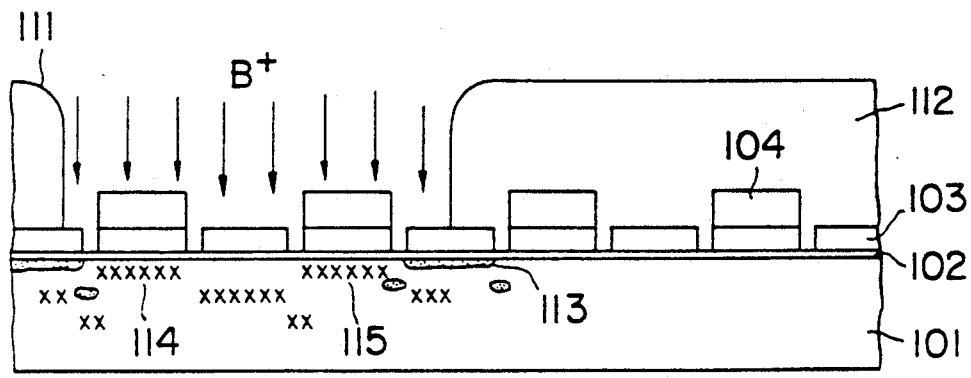
F I G. 1(b)
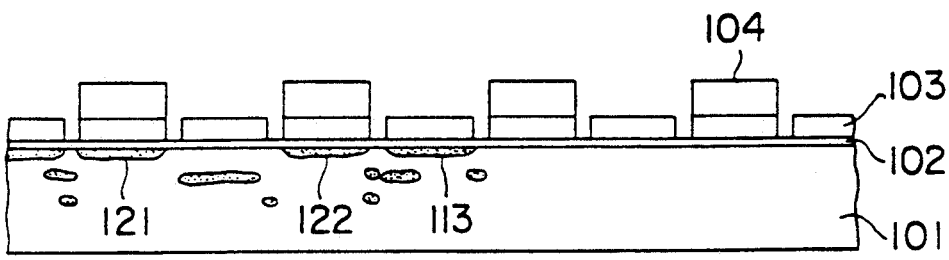
F I G. 1(c)

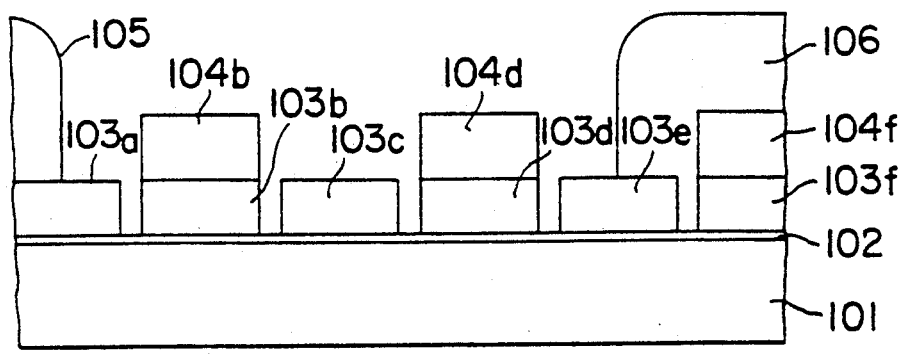
F I G. 3(a)
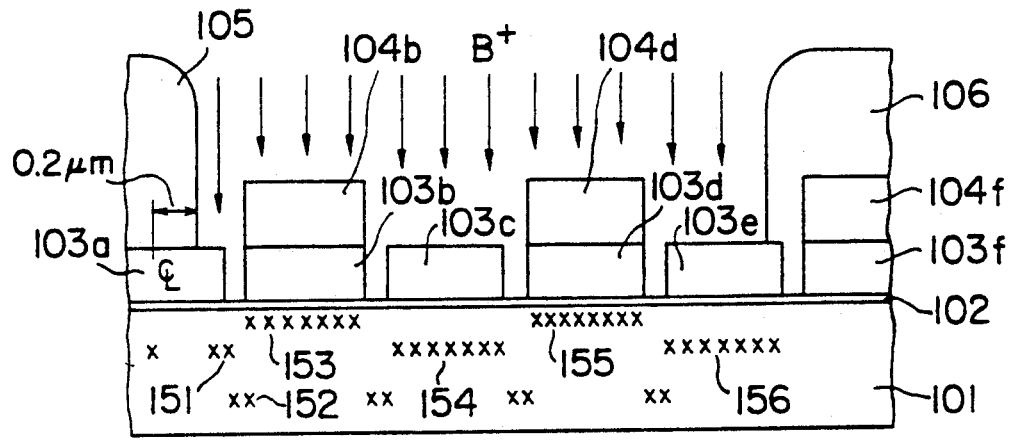
F I G. 3(b)
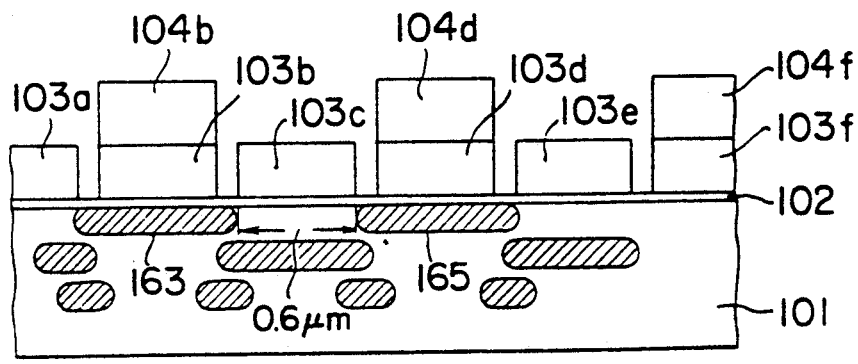
F I G. 3(c)

METHOD OF MANUFACTURING SEMICONDUCTOR DEVICE

BACKGROUND OF THE INVENTION

The present invention relates to a method of manufacturing semiconductor devices particularly suitable for manufacturing mask ROMs.

A conventional method of manufacturing mask ROMs is described, for example, in the technique disclosed in Japanese Patent Laid-Open Publication No. 1-158734. This technique will be explained with reference to FIG. 6 showing cross sections of a mask ROM at each manufacturing step. As shown in FIG. 6(a), a silicon oxide film 602 having a thickness of 200 angstroms is formed on the surface of a semiconductor substrate 601 by means of thermal oxidization under an atmosphere of oxygen containing hydrochloric acid at 900° C. Polysilicon is deposited on the silicon oxide film 602 to a film thickness of 4000 angstroms by means of a low pressure chemical vapor deposition (LPCVD) method. Phosphors are thermally diffused into the formed polysilicon film 603 under a phosphoryl chloride ($POCl_3$) atmosphere. A silicon oxide film 604 is formed on the surface of the device by means of a CVD method. Resist is coated on the surface of the silicon oxide film 604 to form a resist film 605 patterned so as to cover every second gate electrode area.

Using the resist film 605 as a mask, the silicon oxide film 604 is etched by a reactive ion etching method to form a gate oxide film 604a such as shown in FIG. 6(b). The resist film 605 is removed, and resist is again coated and patterned to form a resist film 606 at the area where the gate oxide film 604 is not present.

Next, reactive ion etching is performed with a high selective etching ratio providing an etching speed of the polysilicon film 603 sufficiently faster than that of the gate oxide film 604. As a result, the polysilicon film 603 is etched at the narrow area where the resist film 606 and silicon oxide film 604a are not present. By removing the resist film 606, gate electrodes 603a with a small clearance space therebetween are formed such as shown in FIG. 6(c).

Another conventional method has been used heretofore. This method can reduce a variation of clearances between gate electrodes. This method will be explained with reference to FIG. 7. Similar to the above-described method, a silicon oxide film 702 and polysilicon film 703 are formed on a semiconductor substrate 701 in this order as shown in FIG. 7(a). Phosphors are thermally diffused in the polysilicon film 703. A silicon oxide film 704 is formed on the polysilicon film 703 to a thickness of 4000 angstroms by means of a CVD method. Resist is coated to form a resist film 705 patterned so as to cover every second gate electrode area.

Using the resist film 705 as a mask, the silicon oxide film 704 is etched by a reactive ion etching method to obtain a silicon oxide film 704a shown in FIG. 7(b). Polysilicon is deposited to a thickness of 1000 angstroms by means of an LPCVD method, and etched by an isotropic, reactive ion etching method to form side walls 706 on the sides of the silicon oxide film 704.

As shown in FIG. 7(c), a silicon oxide film 707 is deposited on the whole surface of the device as shown in FIG. 7(c). The thickness of the silicon oxide film 707 is about 4000 angstroms which is about one half of the distance between patterns of the silicon oxide film 704a. After coating resist and flattening the surface of the device, it is etched back by means of a reactive ion etching method to obtain a silicon oxide film 704b whose thickness is thinner than the side walls 706 as shown in FIG. 7(d).

The polysilicon side walls 706 and polysilicon film 703 are etched by a reactive ion etching method to leave a polysilicon film 703a and silicon oxide film 704c on the gate oxide film 702. In this manner, gate electrodes are formed in a self-alignment manner with a constant clearance between gate electrodes.

Examples of devices having gate electrodes formed by the above-described conventional methods are shown in FIGS. 8 and 9. FIG. 8 shows a large scale integrated NOR type mask ROM of a virtual ground array type, and FIG. 9 shows a large scale integrated NAND type mask ROM. In the ROM shown in FIG. 8, buried $n^+$ diffusion regions 801, 802, 803, ... are formed on the surface of a semiconductor substrate at a constant pitch, and gate electrodes 811, 812, 813, ... are formed on the surface of the device perpendicular to the diffusion regions. Such an array layout is disclosed in Sharp Technical Review, pp. 71 to 75, Vol. 40, 1988. Impurity ions are implanted into areas 821 and 822 to write data. In the ROM shown in FIG. 9, element forming areas 901 and 902 surrounded by an element isolation area 900 are formed on the surface of a semiconductor substrate. Contact areas 921 and 922 connected to wiring layers are formed within the respective element forming areas 901 and 902. Gate electrodes 911, 912, 913, ... are formed perpendicular to the element forming areas 901 and 902, and impurity ions are implanted into areas 931 and 932. For such ROMs having gate electrodes formed at a narrow pitch, it is necessary to inject data writing impurity ions into a desired area at a high precision.

Impurity ions are implanted in the following manner. As shown in FIG. 10(a), a silicon oxide film 1002 is formed on the surface of a semiconductor substrate 1001, and polysilicon gate electrodes 1003a, 1003b, ... are disposed. Resist is coated and patterned to remove it only at the areas where impurity ions are implanted into the channel regions under the gate electrodes 1003a, 1003b, .... In this case, the end face of the resist film 1004 is aligned with the center between the gate electrodes 1003a and 1003b. A silicon oxide film formed on the polysilicon gate electrodes has been etched out by using ammonium fluoride solution.

Boron ions ($B^+$) are implanted at a dose of $1 \times 10^{14}$ $cm^{-2}$ and at an acceleration voltage of about 160 keV in order to raise the threshold voltage of an N-channel transistor constituting a memory cell of a NOR type ROM. The width of the gate electrode is set to 0.6 $\mu m$, and a clearance is set to 0.1 $\mu m$, for example. If the end face of the resist film 1004 is precisely aligned with the center between gate electrodes such as shown in FIG. 10(a), then impurity ions are implanted into a region 1011 near the substrate surface under the gate electrode 1003a, and into a deeper region 1012 at the gap between the gate electrode 1003a and the resist film 1004. The region 1012 is so deep from the surface of the semiconductor substrate 1001 that the threshold voltage at the channel region is not influenced. Ions are precisely implanted into the region 1011 corresponding to the width of the subject gate electrode 1003a near the substrate surface, and are not implanted near to the substrate surface of the adjacent gate electrode 1003b.

However, if the position of the resist film 1004 is misaligned such as shown in FIG. 10(b), the following problem occurs. Assuming that the end face of the resist film 1004 is misaligned by 0.2 µm which is three times ($3\sigma$) as large as the standard deviation, impurity ions are implanted not only into the channel region 1011 of the subject gate electrode 1003a, but also into the channel region 1013 of the adjacent gate electrode 1003b.

Thermal treatment after implantation of impurity ions causes the ions to diffuse by about 0.1 µm in the lateral direction. Therefore, as shown in FIG. 10(c), impurity ions are diffused by 0.25 µm into the channel region of the adjacent gate electrode 1003b. As a result, in the NOR type ROM shown in FIG. 8, the channel width of a cell transistor is shortened and the memory cell current is reduced greatly by about 0.6 [(0.6−0.25)/0.6].

In the case of the NAND type ROM shown in FIG. 9, the channel length is shortened, resulting in a possible punch-through or leakage current at the element isolation area 900.

As described above, with the conventional manufacturing methods, misalignment of a resist film causes impurity ions to be implanted into the area under an adjacent gate electrode, resulting in a reduced cell current and punch-through.

SUMMARY OF THE INVENTION

It is therefore an object of the present invention to provide a method of manufacturing a semiconductor device capable of implanting data writing impurity ions into a ROM without adversely affecting the performance of the ROM even there is some mask misalignment, and capable of miniaturizing the device and improving a device integration.

According to the present invention, there is provided a method of manufacturing a semiconductor device, comprising the steps of forming a plurality of gate electrodes on a semiconductor substrate, forming an insulating film on every second gate electrode of the plurality of gate electrodes, coating resist on the surface of the semiconductor device to form a first resist film, patterning the first resist film and removing a predetermined area to form a second resist film, an end face of the second resist film being aligned with the surface of the gate electrode without the insulating film, implanting impurity ions, using the second resist film as a mask, at an acceleration voltage allowing the implanted ions to stop near to the surface of the semiconductor substrate under the gate electrode with the insulating film, of these the gate electrodes not covered with the second resist film, removing the second resist film and coating resist on the surface of the semiconductor device to form a third resist film, patterning the third resist film and removing a predetermined area to form a fourth resist film, the end face of the fourth resist film being aligned with the surface of the gate electrode with the insulating film, implanting the impurity ions, using the fourth resist film as a mask, at an acceleration voltage allowing to stop the implanted impurity ions near to the surface of the semiconductor substrate under the gate electrode without the insulating film among the gate electrodes not covered with the fourth resist film.

A gate electrode with an insulating film and a gate electrode without an insulating film are alternately formed. The second resist film is formed on the semiconductor device, the second resist film has a predetermined area corresponding the impurity ion implantation which has been removed from the second resist film, and the end face thereof is aligned with the surface of the gate electrode without the insulating film. Using the second resist film as a mask, ions are implanted at an acceleration voltage allowing the ions to stop near to the surface of the substrate under the gate electrode with the insulating film. Under the gate electrode without the insulating film and under the clearance between the gate electrodes, the impurity ions are implanted to areas so deep from the substrate surface that no adverse influence is given to device performance. Even with mask misalignment, the device performance is not degraded if the end face of the second resist film is aligned with the surface of the gate electrode, and ions are not implanted near at the surface of the semiconductor substrate under an adjacent gate electrode. On the contrary, if the fourth resist film is formed, ions are implanted at an acceleration voltage allowing the ions to stop near at the surface of the substrate under the gate electrode without the insulating film. Ions implanted toward the gate electrode with the insulating film will not reach the substrate surface, ions implanted via the clearance between the gate electrodes go down into an area sufficiently deep from the substrate surface, and ions are not implanted near at the substrate surface under an adjacent electrode.

The impurity ions diffuse in the lateral direction by a thermal treatment process, either after implanting the impurity ions using the second resist film as a mask, or after implanting the impurity ions using the fourth resist film as a mask.

The insulating film may use any film made of insulating material, such as a silicon oxide film and a silicon nitride film.

The same advantageous effects can also be obtained for the case of an insulating film having a first thickness and an insulating film having a second thickness different from the first thickness are alternately formed on each gate electrode. With the second resist film, impurity ions are implanted only near at the substrate surface under the gate electrode having the second thickness insulating film. With the fourth resist film, impurity ions are implanted only near to the substrate surface under the gate electrode having the first thickness insulating film, and ions are not implanted near at the surface under an adjacent gate electrode. Therefore, high integration is possible without influencing device performance.

BRIEF DESCRIPTION OF THE DRAWINGS

In the accompanying drawings:

FIG. 1 is cross sections of a semiconductor device showing each step of the method of manufacturing a semiconductor device according to an embodiment of the present invention;

FIG. 3 is cross sections of a semiconductor device showing each step of implanting impurity ions according to the embodiment method;

DESCRIPTION OF THE PREFERRED EMBODIMENTS

Figure 6A:
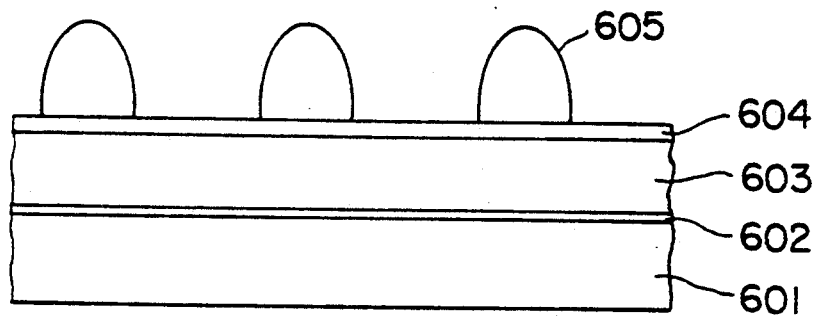
FIG. 6 is cross sections of a semiconductor device showing each step of a conventional method of manufacturing a semiconductor device.
Figure 6B:
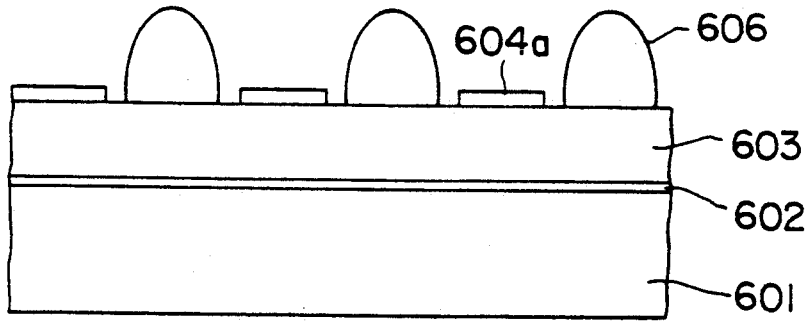
Figure 6C:
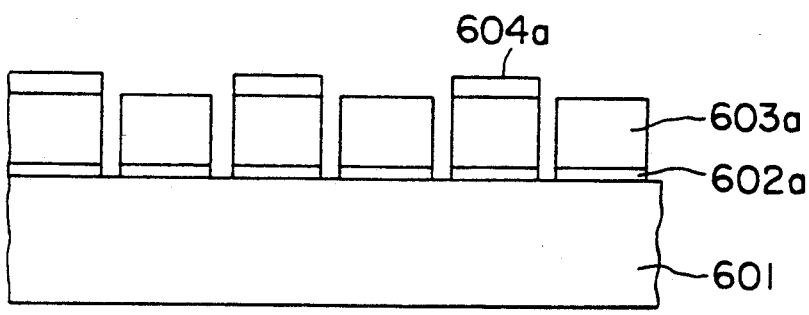
Figure 7A:
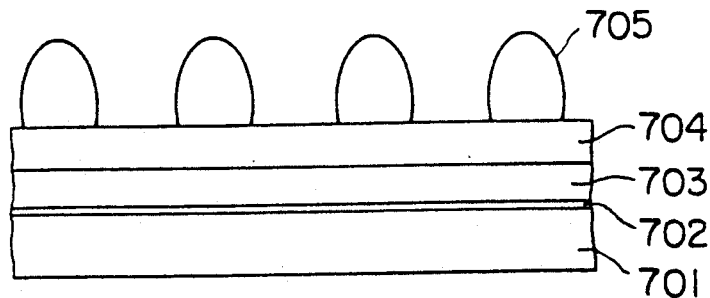
FIG. 7 is cross sections of a semiconductor device showing each step of another conventional method of manufacturing a semiconductor device.
Figure 7B:
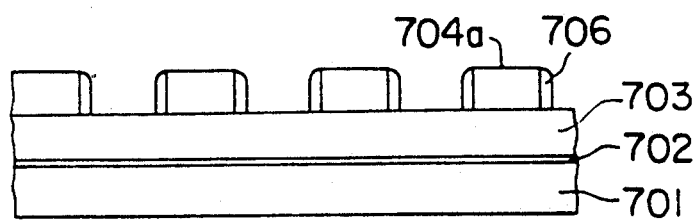
Figure 7C:
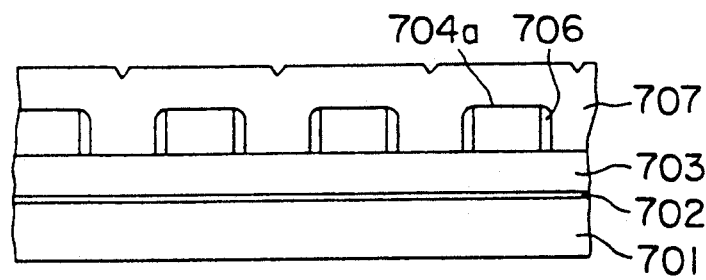
Figure 7D:
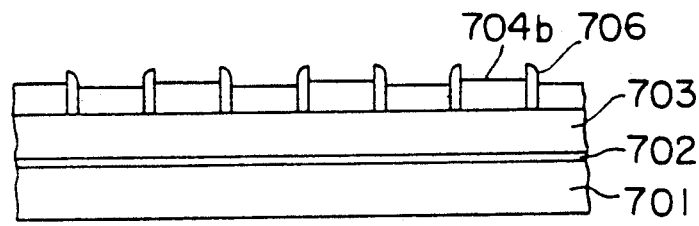
Figure 7E:
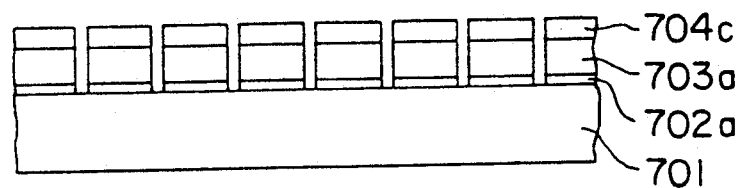
Figure 8:
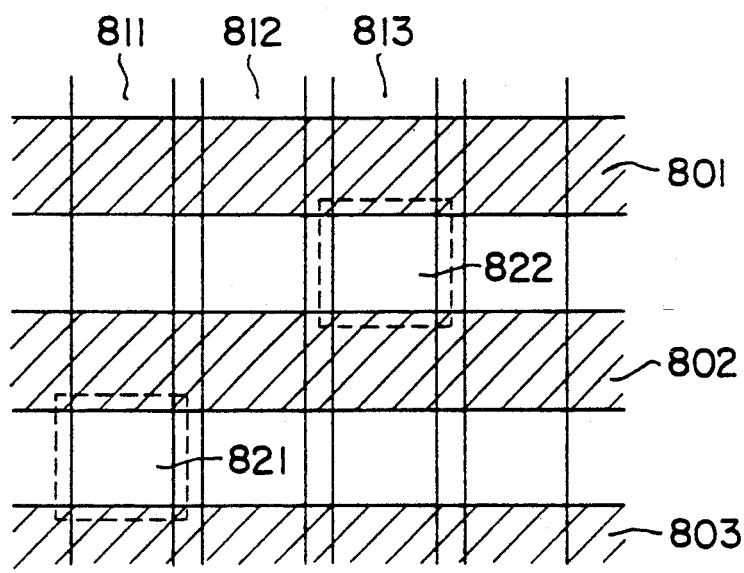
FIG. 8 is a plan view showing the layout of a NOR type mask ROM.
Figure 9:
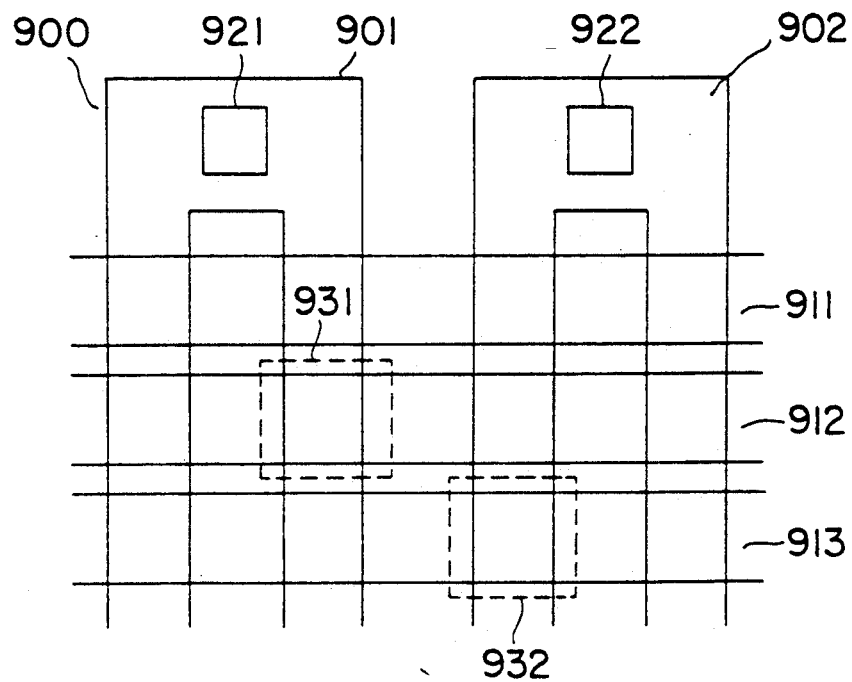
FIG. 9 is a plan view showing the layout of a NAND type mask ROM.
Figure 10A:
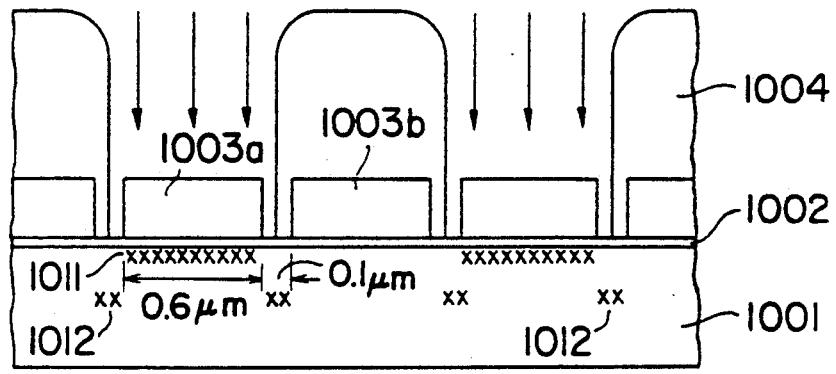
FIG. 10 is cross sections of a semiconductor device manufactured by implanting impurity ions according to a conventional method.
Figure 10B:
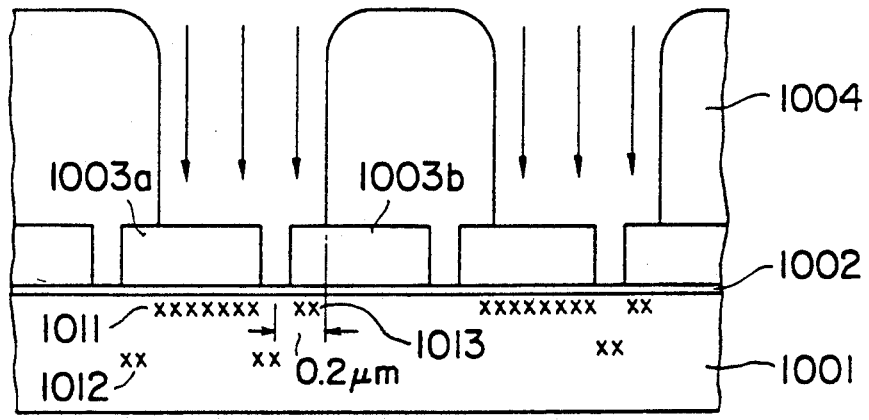
Figure 10C:
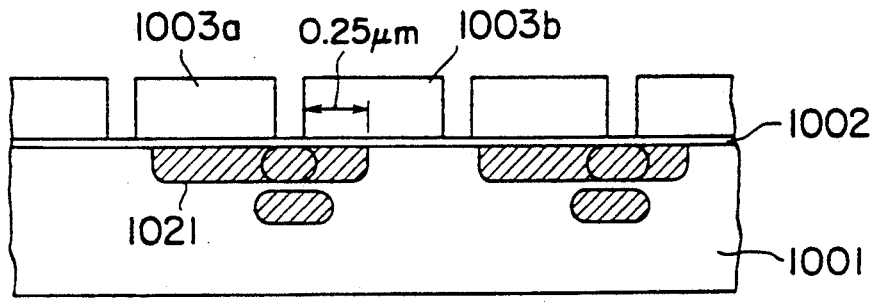

An embodiment of the present invention will be described with reference to FIG. 1. In the same manner as a conventional method, a gate oxide film 102, a polysilicon film 103, and a silicon oxide film 104 are formed on a semiconductor substrate 101 in this order. A difference from a conventional device is that the thickness of the silicon oxide film 104 is made thicker to 4000 angstroms. Thereafter, patterning is performed in the same manner as a conventional method shown in FIGS. 6(a) and 6(b), to alternately form a gate electrode having the polysilicon film 103 of 4000 angstroms and a gate electrode having the polysilicon film 103 and silicon oxide film 104 of the same thickness, as shown in FIG. 1(a).

Under this condition, impurity ions are implanted into one of the channel region of the gate electrode without the silicon oxide film 104 (hereinafter called a thinner gate electrode) and the channel region of the gate electrode with the silicon oxide film 104 (hereinafter called a thicker gate electrode).

In implanting ions into the channel region under the thinner gate electrode, resist films 105 and 106 such as shown in FIG. 1(a) are used as a mask. The end faces of the resist films 105 and 106 are aligned with generally the centers of the thicker gate electrodes. Using such resist films 105 and 106, boron ions (B+) for example are implanted at an acceleration voltage of about 180 keV, into the channel region 108 under the thinner gate electrode. The boron ions are also implanted into regions 107 and 109 deep from the substrate of the semiconductor substrate 101 via the clearances between the thinner and thicker gate electrodes. The impurity ions implanted into the regions 107 and 109 deep from the semiconductor substrate 101 surface do not influence the threshold voltage of the channel region, so they can be neglected from the viewpoint of device performance. The impurity ions implanted toward the thicker gate electrode will stop at the intermediate thereof and will not reach the semiconductor substrate 101 surface, so they will not influence the threshold voltage.

In implanting ions into the channel region of the thicker gate electrode, resist films 111 and 112 are formed as shown in FIG. 1(b). In contrast with the case shown in FIG. 1(a), the end faces of the resist films 111 and 112 are aligned with generally the centers of the thinner gate electrodes. Using the resist films 111 and 112 as a mask, boron ions (B+) are implanted at an acceleration voltage of about 360 keV. In this case, the boron ions are implanted only into the channel regions 114 and 115 of the thicker gate electrodes. The boron ions implanted via the clearances between the gate electrodes or toward the thinner gate electrodes go down into regions deep from the semiconductor substrate 101 surface, without giving any adverse influence on transistor performance. The impurity ions implanted into the channel region 108 of the thinner gate electrode at the step shown in FIG. 1(a) are diffused to a region 113 by thermal treatment as shown in FIG. 1(b).

After further thermal treatment, the implanted impurities are diffused into regions 121 and 122 as shown in FIG. 1(c).

Figure 2A:
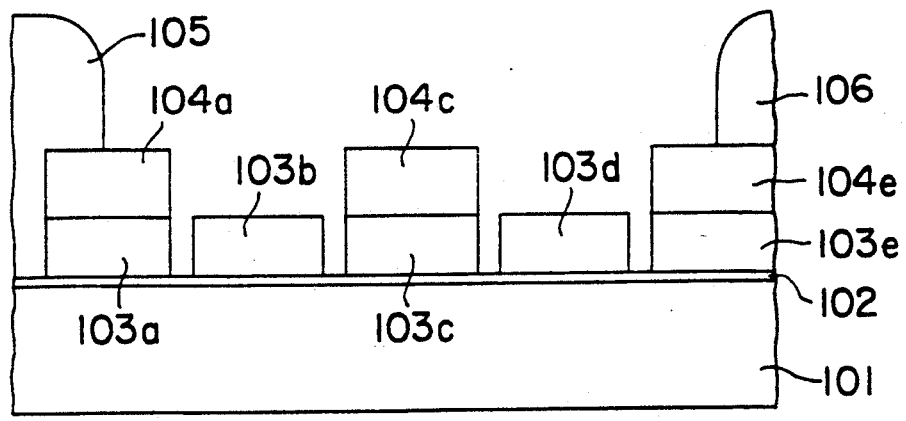
FIG. 2 is cross sections of a semiconductor device showing each step of implanting impurity ions according to the embodiment method.

According to the above-described embodiment, impurities will not be implanted into the channel region of an adjacent gate electrode even if there is mask misalignment. This will be detailed below. FIG. 2 are cross sections of a semiconductor device at each step of implanting impurities into the channel region under the thinner gate electrode. FIG. 2(a) corresponds to the case where there is no mask misalignment. The end face of a resist film 105 is aligned with generally the center of the thicker gate electrode having a polysilicon film 103a and silicon oxide film 104a, and the end face of a resist film 106 is similarly aligned with generally the center of the thicker gate electrode having the polysilicon film 103e and silicon oxide film 104e.

Figure 2B:
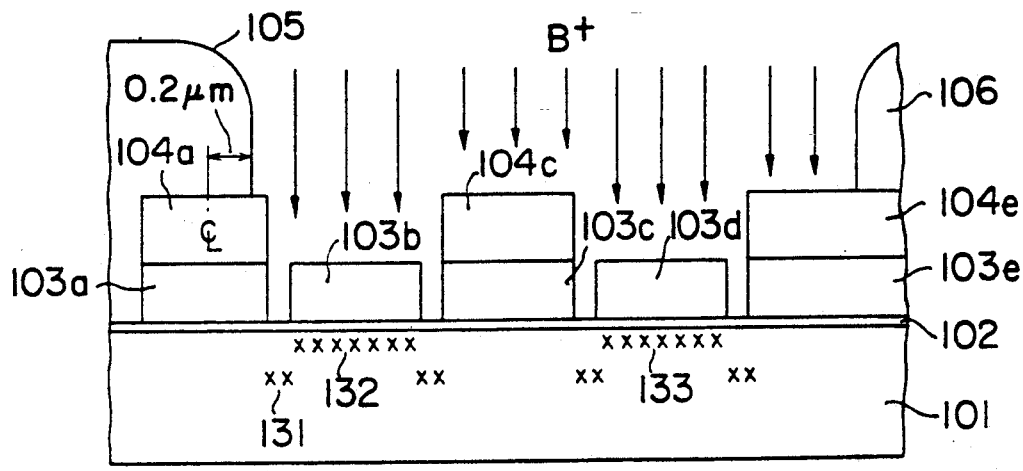
Figure 2C:
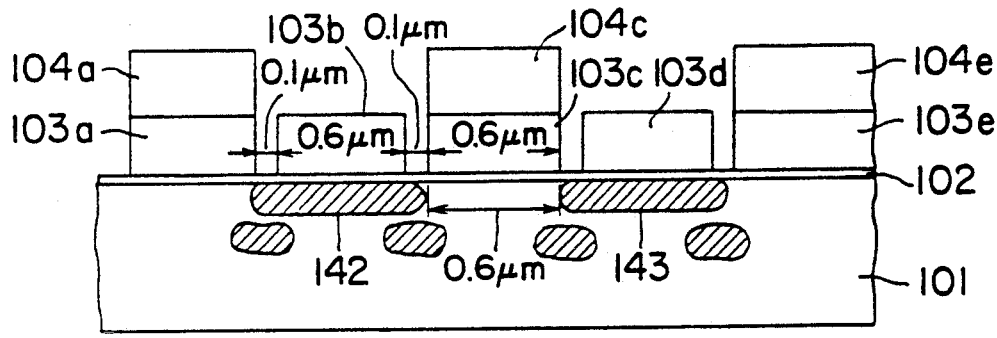

Assuming mask misalignment of 0.2 $\mu$m to the right, resist films 105 and 106 such as shown in FIG. 2(b) are formed. Using the resist films 105 and 106 as a mask, ions are implanted at an acceleration voltage of 160 keV. In this case, the impurity ions implanted via the clearances between the gate electrodes go down into regions 131 deeper than the semiconductor substrate 101 surface. The impurity ions implanted toward the thicker gate electrodes (with polysilicon film 103c and silicon oxide film 104c, and polysilicon film 103e and silicon oxide film 104e stop at the intermediate thereof. The same results as the case of no mask misalignment shown in FIG. 2(a) are therefore obtained. Accordingly, even if ions diffuse by 0.1 $\mu$m in the lateral direction by thermal treatment, the effective channel width of the thicker gate electrode can be retained at 0.6 $\mu$m without permitting impurities being diffused to the channel region of the thicker gate electrode, giving no adverse influences on device performance.

Next, ion implantation into the channel region of the thinner gate electrode will be detailed. FIG. 3(a) corresponds to the case where there is no mask misalignment. The end face of a resist film 105 is aligned with generally the center of the thinner gate electrode having the polysilicon film 103a, and the end face of a resist film 106 is similarly aligned generally with the center of the thicker gate electrode having the polysilicon film 103a.

Assuming mask misalignment of 0.2 $\mu$m to the right, resist films 105 and 106 such as shown in FIG. 3(b) are formed. Using the resist films 105 and 106 as a mask, ions are implanted at an acceleration voltage of 320 keV. In this case, the impurity ions are implanted only into the channel regions 153 and 155 under the thicker gate electrodes (with polysilicon film 103b and silicon oxide film 104b, and polysilicon film 103d and silicon oxide film 104e). The ions implanted into regions 154 and 156 deep from the semiconductor substrate 101 surface will not influence the threshold voltage, and ions implanted via the clearances between the gate electrodes go down deeper into regions 152. As a result, ions are implanted only near the surface of the semiconductor substrate 101 under the thicker electrodes.

Upon thermal treatment, the impurities under the thicker gate electrodes diffuse into regions 163 and 165 as shown in FIG. 3(c). Even if the impurities in these regions 163 and 165 diffuse by 0.1 $\mu$m in the lateral direction, the effective channel width of the thinner gate electrode can be retained to be 0.6 μm same as the case of FIG. 2(c), without giving any adverse influences on the threshold voltage of the thinner gate electrode.

Next, another embodiment of the method of manufacturing a semiconductor device according to the present invention will be described with reference to FIG. 4.

Similar to the above-described embodiment, a silicon oxide film 202 of 200 angstroms and a polysilicon film 203 of 4000 angstroms are formed on a semiconductor substrate 201 in this order. Phosphor ions (P+) are thermally diffused in the polysilicon film 203 under a phosphoryl chloride (POCl$_3$) atmosphere. Thereafter, a silicon oxide film 204 is formed on the surface of the device by means of a CVD method to a thickness of 4000 angstroms. A polysilicon film 205 is formed on the silicon oxide film 204 by means of an LPCVD method to a thickness of 1000 angstroms. Resist is coated to form a resist film 206 patterned so as to cover every second gate electrode area.

Using the resist film 206 as a mask, the silicon oxide film 204 and polysilicon film 205 are subject to reactive ion etching, respectively under different etching conditions, to thereby form a silicon oxide film 214 and polysilicon film 215. Thereafter, polysilicon is deposited to a thickness of 1000 angstroms by an LPCVD method, and then anisotropic, reactive ion etching is performed to form side walls 216.

Figure 4A:
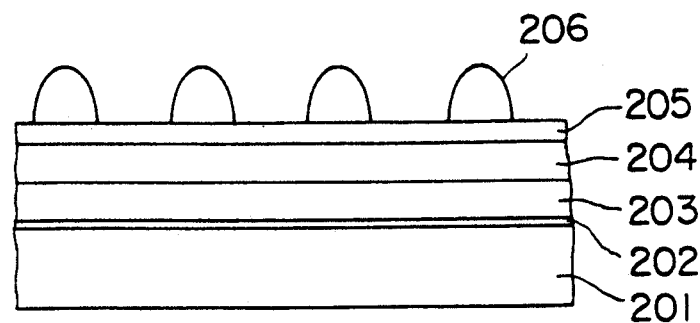
FIG. 4 is cross sections of a semiconductor device showing each step of the method of manufacturing a semiconductor device according to another embodiment of the present invention.
Figure 4B:
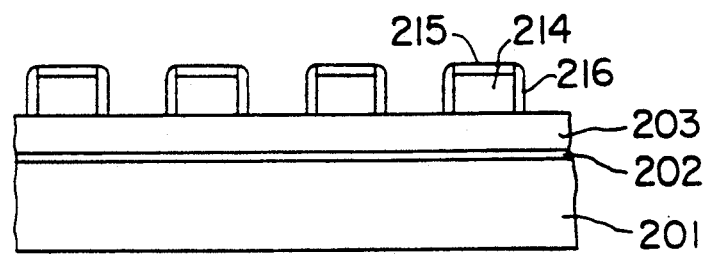
Figure 4C:
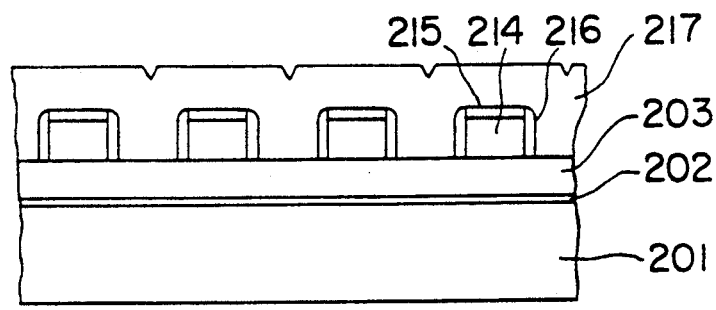
Figure 4D:
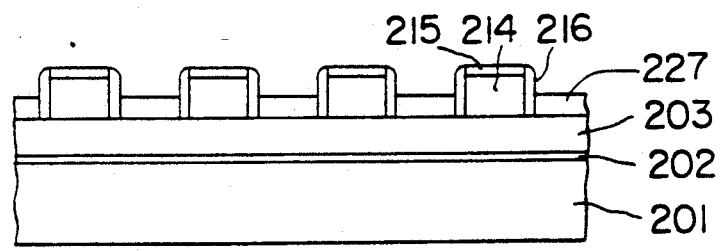

As shown in FIG. 4(c), a silicon oxide film 217 is deposited on the whole surface of the device to a thickness of 4000 angstroms by means of a CVD method.

After coating resist and flattening of the surface of the device, it is etched back by means of a reactive ion etching method providing a higher etching ratio of the silicon oxide film 217, leaving some portion of the silicon oxide film 217 as a silicon oxide film 227 between combinations of the silicon oxide film 214, polysilicon film 215, and side walls 216. In this manner, the silicon oxide film 214 and silicon oxide film 227 having different thicknesses are alternately formed on the surface of the semiconductor device.

Figure 4E:
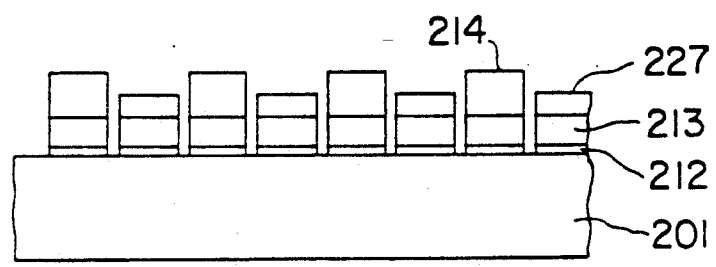

The polysilicon film 215 and side walls 216 are subject to reactive ion etching providing a higher etching ratio of the silicon oxide films 214 and 227 than the polysilicon film 215 and side walls 216. As a result, polysilicon films 213 are formed on gate oxide films 212 with a narrow predetermined clearance therebetween, and silicon oxide films 214 having a different thickness are alternately formed thereon, as shown in FIG. 4(e).

Figure 5A:
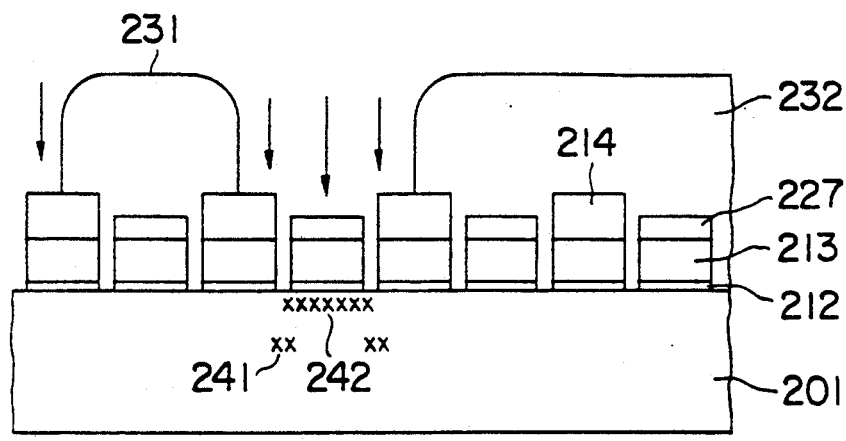
FIG. 5 is cross sections of a semiconductor device showing each step of the embodiment method.
Figure 5B:
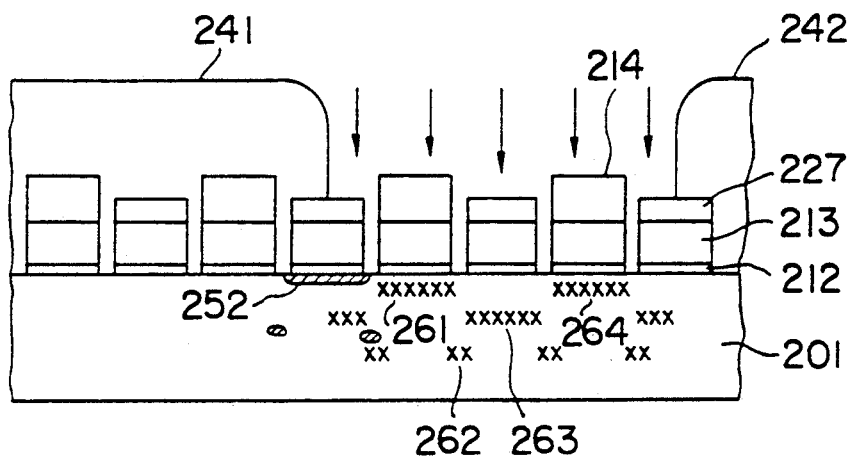
Figure 5C:
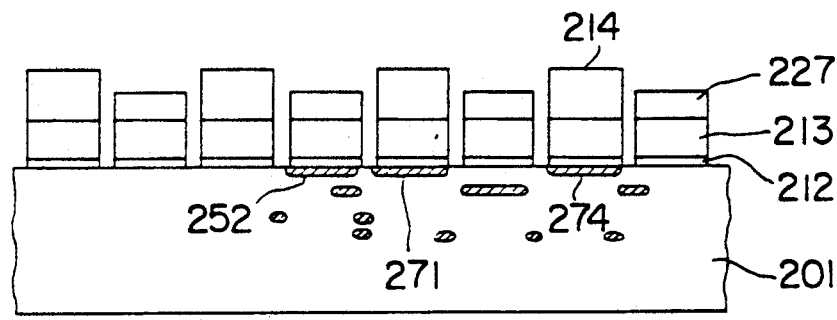

Thereafter, ions are implanted into the channel region under a desired gate electrode. First, in implanting ions into the channel region under the thinner gate electrode with the silicon oxide film 227, resist films 231 and 232 are formed with their end faces being aligned with generally the centers of the thicker gate electrodes such as shown in FIG. 5(a). Using the resist films 231 and 232 as a mask, ions are implanted for example at an acceleration voltage of 220 keV and at a dose of $1 \times 10^{14}$ cm$^{-2}$ so as to stop them at the channel region 242 under the thinner gate electrode. Similar to the above-described embodiment, ions are implanted via the clearances between the gate electrodes into a region 242 sufficiently deep from the semiconductor substrate 201 for giving no adverse influence upon device performance. In implanting ions into the channel region of the thicker gate electrode, resist films 241 and 242 are formed with their end faces aligned with generally the centers of the thinner gate electrodes. Using the resist films 241 and 242 as a mask, ions are implanted for example at an acceleration voltage of 360 keV and at a dose of $1 \times 10^{14}$ cm$^{-2}$ so as to stop them at the channel regions 261 and 264 under the thicker gate electrodes. Ions are implanted into a region 263 deep from the semiconductor substrate 201 surface under the thinner gate electrode, giving no adverse influence to device performance. The implanted ions are diffused into regions 252, 271, and 274 such as shown in FIG. 5(c).

As described so far, according to the manufacturing methods of the present invention, gate electrodes having different thickness are alternatively formed, and ions are implanted to the channel region under a thinner gate electrode or thicker gate electrode, by using a resist film formed differently for implantations into the channel regions of the thinner and thicker gate electrodes. In this manner, it is possible to inject ions into the channel region under a thinner or thicker gate electrode and in a self-alignment manner, while preventing ions from being implanted into the channel region under an adjacent gate electrode and avoiding adverse influence upon the threshold voltage, thus contributing to miniaturization and high integration of ROMs.

The above-described embodiments are given only for illustrative purposes, and are not intended to limit the scope of the present invention. For example, in implanting impurity ions into the channel region under a gate electrode, they may be implanted first into the channel region of a thicker gate electrode or of a thinner gate electrode. Furthermore, the material of each film is not limited to those described with the embodiments. For example, the material of a gate electrode may use silicide or polycide instead of polysilicon. A film formed on a gate electrode is not limited to a silicon oxide film, but other insulating material such as silicon nitride film may also be used.

What is claimed is:

1. A method of manufacturing a semiconductor device comprising the steps of:

forming a plurality of gate electrodes on a semiconductor substrate and an insulating film on every second gate electrode of said plurality of gate electrodes;

coating resist on the surface of said semiconductor device to form a first resist film;

patterning said first resist film and removing a predetermined area to form a second resist film, an end face of said second resist film being aligned with the surface of a gate electrode without said insulating film;

implanting impurity ions, using said second resist film as a mask, at an acceleration voltage allowing to stop said implanted ions near to the surface of said semiconductor substrate under a gate electrode with said insulating film not covered with said second resist film;

removing said second resist film and coating resist on the surface of said semiconductor device to form a third resist film;

patterning said third resist film and removing a predetermined area to form a fourth resist film, an end face of said fourth resist film being aligned with the surface of a gate electrode with said insulating film; and implanting impurity ions, using said fourth resist film as a mask, at an acceleration voltage allowing to stop said implanted impurity ions near to the surface of said semiconductor substrate under a gate electrode without said insulating film not covered with said fourth resist film.

2. A method of manufacturing a semiconductor device comprising the steps of:

forming a plurality of gate electrodes on a semiconductor substrate and an insulating film on every second gate electrode of said plurality of gate electrodes;

coating resist on the surface of said semiconductor device to form a first resist film;

patterning said first resist film and removing a predetermined area to form a second resist film, an end face of said second resist film being aligned with the surface of a gate electrode without said insulating film;

implanting impurity ions, using said second resist film as a mask, at an acceleration voltage allowing to stop said implanted ions near to the surface of said semiconductor substrate under a gate electrode with said insulating film not covered with said second resist film;

performing a thermal diffusion process to diffuse said implanted impurity ions;

removing said second resist film and coating resist on the surface of said semiconductor device to form a third resist film;

patterning said third resist film and removing a predetermined area to form a fourth resist film, an end face of said fourth resist film being aligned with the surface of a gate electrode with said insulating film;

implanting impurity ions, using said fourth resist film as a mask, at an acceleration voltage allowing to stop said implanted impurity ions near to the surface of said semiconductor substrate under a gate electrode without said insulating film not covered with said fourth resist film; and performing a thermal diffusion process to diffuse said implanted impurity ions.

3. A method of manufacturing a semiconductor device according to claim 1, wherein said insulating film is a silicon oxide film or a silicon nitride film.

4. A method of manufacturing a semiconductor device according to claim 2, wherein said insulating film is a silicon oxide film or a silicon nitride film.

5. A method of manufacturing a semiconductor device comprising the steps of:

forming a plurality of gate electrodes on a semiconductor substrate and insulating films having a first thickness and a second thickness different from said first thickness alternately, on every second gate electrode of said plurality of gate electrodes;

coating resist on the surface of said semiconductor device to form a first resist film;

patterning said first resist film and removing a predetermined area to form a second resist film, an end face of said second resist film being aligned with the surface of an insulating film having said first thickness;

implanting impurity ions, using said second resist film as a mask, at an acceleration voltage allowing to stop said implanted ions near to the surface of said semiconductor substrate under a gate electrode with said insulating film having said second thickness not covered with said second resist film;

removing said second resist film and coating resist on the surface of said semiconductor device to form a third resist film;

patterning said third resist film and removing a predetermined area to form a fourth resist film, an end face of said fourth resist film being aligned with the surface of a gate electrode with said insulating film having said second thickness; and implanting impurity ions, using said fourth resist film as a mask, at an acceleration voltage allowing to stop said implanted impurity ions near to the surface of said semiconductor substrate under a gate electrode with said insulating film having said first thickness not covered with said fourth resist film.

6. A method of manufacturing a semiconductor device comprising the steps of:

forming a plurality of gate electrodes on a semiconductor substrate and insulating films having a first thickness and a second thickness different from said first thickness alternately, on every second gate electrode of said plurality of gate electrodes;

coating resist on the surface of said semiconductor device to form a first resist film;

patterning said first resist film and removing a predetermined area to form a second resist film, an end face of said second resist film being aligned with the surface of an insulating film having said first thickness;

implanting impurity ions, using said second resist film as a mask, at an acceleration voltage allowing to stop said implanted ions near to the surface of said semiconductor substrate under a gate electrode with said insulating film having said second thickness not covered with said second resist film;

performing a thermal diffusion process to diffuse said implanted impurity ions;

removing said second resist film and coating resist on the surface of said semiconductor device to form a third resist film;

patterning said third resist film and removing a predetermined area to form a fourth resist film, an end face of said fourth resist film being aligned with the surface of a gate electrode with said insulating film having said second thickness;

implanting impurity ions, using said fourth resist film as a mask, at an acceleration voltage allowing to stop said implanted impurity ions near to the surface of said semiconductor substrate under a gate electrode with said insulating film having said first thickness not covered with said fourth resist film; and performing a thermal diffusion process to diffuse said implanted impurity ions.

7. A method of manufacturing a semiconductor device according to claim 5, wherein said insulating films are silicon oxide or silicon nitride films.

8. A method of manufacturing a semiconductor device according to claim 6, wherein said insulating films are silicon oxide or silicon nitride films.

9. A method according to claim 1, wherein the impurity ions comprise boron ions.

10. A method according to claim 1, wherein the gate electrodes comprises silicide, polycide, or polysilicon.

11. A method according to claim 1, wherein the gate electrodes comprise polysilicon and the insulating films comprise silicon oxide film.

12. A method according to claim 1, wherein the steps to implant the impurity ions underneath the gate electrodes with the insulating film are performed prior to the steps to implant the impurity ions underneath the gate electrodes without the insulating film.

13. A method according to claim 1, wherein the steps to implant the impurity ions underneath the gate electrodes without the insulating film are performed prior to the steps to implant the impurity ions underneath the gate electrodes with the insulating film.

14. A method according to claim 5, wherein the first thickness is thinner than the second thickness.

15. A method according to claim 5, wherein the first thickness is thicker than the second thickness.

16. A method according to claim 5, wherein the impurity ions comprise boron ions.

17. A method according to claim 5, wherein the gate electrodes comprise silicide, polycide, or polysilicon.

18. A method according to claim 5, wherein the gate electrodes comprise polysilicon and the insulating films comprise silicon oxide film.

19. A method according to claim 2, wherein the gate electrodes comprise polysilicon and the insulating films are silicon oxide films.

20. A method according to claim 6, wherein the gate electrodes comprise polysilicon and the insulating films are silicon oxide films.

* * * * *